(12) United States Patent
Shimizu et al.

(10) Patent No.: US 7,307,307 B2
(45) Date of Patent: Dec. 11, 2007

(54) NON-VOLATILE SEMICONDUCTOR MEMORY DEVICE HAVING MEMORY CELL ARRAY SUITABLE FOR HIGH DENSITY AND HIGH INTEGRATION

(75) Inventors: Kazuhiro Shimizu, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/179,958

(22) Filed: Jun. 26, 2002

(65) Prior Publication Data

US 2002/0171112 A1 Nov. 21, 2002

Related U.S. Application Data

(60) Provisional application No. 09/925,418, filed on Aug. 10, 2001, now Pat. No. 6,784,503.

(30) Foreign Application Priority Data

Aug. 11, 2000 (JP) ............................. 2000-245029

(51) Int. Cl.
*H01L 29/788* (2006.01)
(52) U.S. Cl. ...................................... 257/316; 257/324
(58) Field of Classification Search ................ 257/316, 257/324
See application file for complete search history.

(56) References Cited

U.S. PATENT DOCUMENTS

| 4,471,373 | A | * | 9/1984 | Shimizu et al. ............ 257/315 |
| 4,495,693 | A | * | 1/1985 | Iwahashi et al. ............ 438/258 |
| 4,766,088 | A | * | 8/1988 | Kono et al. ................ 438/258 |
| 5,472,892 | A | * | 12/1995 | Gwen et al. ............... 438/587 |
| 5,482,894 | A | * | 1/1996 | Havemann .................. 438/623 |
| 5,514,889 | A | * | 5/1996 | Cho et al. .................. 257/316 |
| 5,559,048 | A | * | 9/1996 | Inoue ........................ 438/257 |
| 5,565,384 | A | * | 10/1996 | Havemann .................. 438/702 |
| 5,766,996 | A | * | 6/1998 | Hayakawa et al. ......... 438/257 |

(Continued)

FOREIGN PATENT DOCUMENTS

JP 7-254638 10/1995

OTHER PUBLICATIONS

U.S. Appl. No. 09/670,990, filed Sep. 26, 2000, pending.

(Continued)

*Primary Examiner*—Howard Weiss
(74) *Attorney, Agent, or Firm*—Oblon, Spivak, McClelland, Maier & Neustadt, P.C.

(57) ABSTRACT

First and second semiconductor regions are formed apart from each other on a semiconductor body. A stacked gate is formed on the semiconductor body between the first and second semiconductor regions. The stacked gate has a first side surface, a second side surface opposed to the first side surface, and an upper surface. A contact material is buried in an interlayer insulating film above the semiconductor body, to be adjacent to the first side surface of the stacked gate. The contact material contacts the first semiconductor region. A first insulating film is formed on the second side surface and the upper surface, except the first side surface of the stacked gate adjacent to the contact material. A second insulating film is formed on the first side surface of the stacked gate adjacent to the contact material, and the first insulating film.

7 Claims, 11 Drawing Sheets

U.S. PATENT DOCUMENTS

| | | | |
|---|---|---|---|
| 6,023,085 A * | 2/2000 | Fang | 257/315 |
| 6,060,740 A * | 5/2000 | Shimizu et al. | 257/314 |
| 6,160,297 A | 12/2000 | Shimizu et al. | |
| 6,228,714 B1 * | 5/2001 | Choi | 438/258 |
| 6,376,879 B2 * | 4/2002 | Mori et al. | 257/347 |
| 6,483,172 B1 * | 11/2002 | Cote et al. | 257/639 |
| 6,563,168 B2 * | 5/2003 | Lee | 257/316 |
| 6,747,311 B2 * | 6/2004 | Goda et al. | 257/326 |
| 7,109,547 B2 * | 9/2006 | Shimizu et al. | 257/314 |

OTHER PUBLICATIONS

U.S. Appl. No. 09/714,228, Nov. 17, 2000, pending.
U.S. Appl. No. 10/179,958, Jun. 26, 2002, pending.

* cited by examiner

ELEMENT REGION
ELEMENT SEPARATION REGION

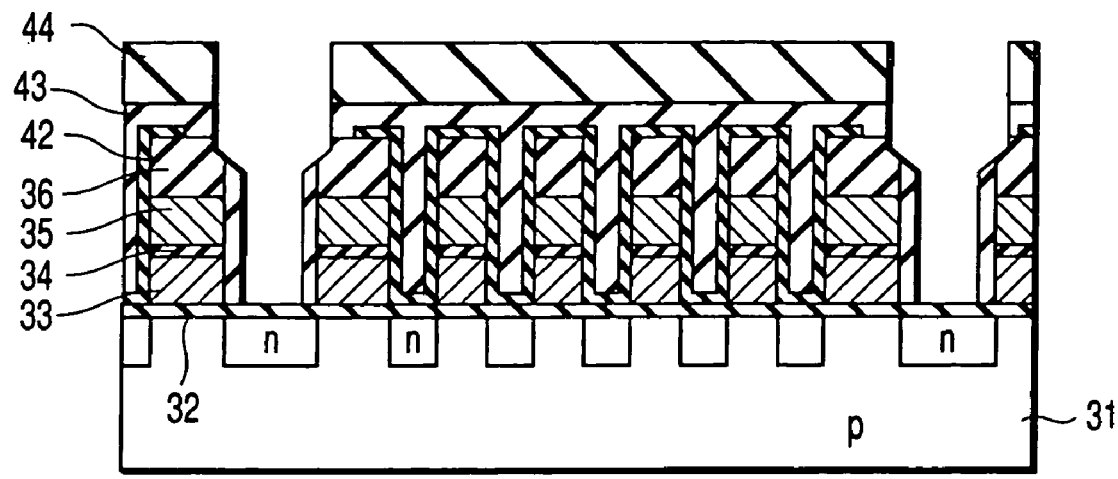
F I G. 9A
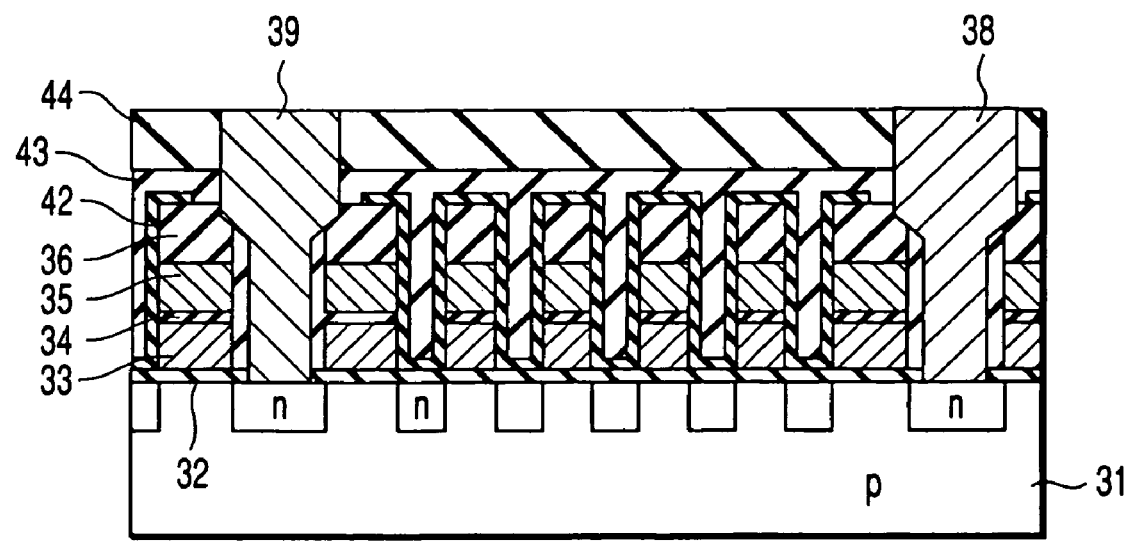
F I G. 9B

NON-VOLATILE SEMICONDUCTOR MEMORY DEVICE HAVING MEMORY CELL ARRAY SUITABLE FOR HIGH DENSITY AND HIGH INTEGRATION

CROSS-REFERENCE TO RELATED APPLICATIONS

This application is based upon and claims the benefit of priority from the prior Japanese Patent Application No. 2000-245029, filed Aug. 11, 2000, the entire contents of which are incorporated herein by reference. This application is also a divisional application of parent application Ser. No. 09/925,418, filed on Aug. 10, 2001 now U.S. Pat. No. 6,784,503.

BACKGROUND OF THE INVENTION

1. Field of the Invention

The present invention relates to a non-volatile semiconductor memory device, and particularly to a non-volatile semiconductor memory device having a memory cell array suitable for high density and high integration.

2. Description of the Related Art

A flash memory is well known as a non-volatile semiconductor memory device, which enables electric re-writing of data and is suitable for high density and large capacity. Generally, in a flash memory, a plurality of memory cells each having a MOS transistor structure with a stacked gate in which a charge storage layer and a control gate are layered are provided in a matrix. A word-line signal is inputted to the control gates of these memory cells, and a bit-line signal is inputted to sources or drains of the memory cells.

FIG. 1A is a plan view showing the structure of the memory cell array in a NOR-type flash memory. FIG. 1B is a cross-sectional view cut along the line 1B-1B of the memory cell array shown in FIG. 1A.

As shown in FIG. 1B, a charge storage layer 103 is formed on a p-type silicon semiconductor substrate 101 with a tunnel gate insulating film 102 inserted therebetween. A control gate 105 is formed on the charge storage layer 103 with an inter-gate insulating film 104 inserted therebetween. Each memory cell has a stacked gate in which the charge storage layer 103 and the control gate 105 are layered. This stacked gate is processed vertically in a self-aligning manner such that side end parts thereof are aligned.

Also, the memory cells each have a source region 106A and a drain region 106B which are formed of an n-type diffusion layer. The source region 106A and the drain region 106B are formed in the semiconductor substrate 101 at both sides of the stacked gate. One of the source region 106A and the drain region 106B is connected to a bit line 108 through a bit-line contact material 107, and the other is connected to a common source line 110 through a common source line contact material 109.

A structure interposing a contact material like the bit line, a structure directly connected through a buried metal line, a structure in which sources of memory cells of each bit line are connected with use of a diffusion layer, or the like is widely used to connect the common source line 110 and the source region 106A to each other. The case of connection to the common source line 110 through the contact material 109 is now shown.

The bit-line contact material 107 described above has a side end part adjacent to a stacked gate and is constructed in a so-called self-aligned contact structure in which a part of the contact material 107 extends over the stacked gate, at its connecting part to a bit line 108. This structure is adopted to eliminate a dimensional margin between the bit-line contact material 107 and the stacked gate, so that the memory cell array can be downsized.

To attain the self-aligned contact structure, the stacked gate is covered with a cap material 111, e.g., a silicon nitride film. In particular, the cap material 111 is formed thick on the control gate 105. In this manner, the contact material 107 buried in a contact hole and the control gate 105 are prevented from being short-circuited. A conductive material such as low-resistance poly-silicon or metal material is used for the contact material 107. Note that the reference 112 denotes an inter-layer insulating film made of a BPSG film or the like.

The common source-line contact material 109 is not constructed in a self-aligned contact structure but a special margin is maintained between the stacked gate and the contact material 109. This is because a potential difference of about 10 V occurs in a NOR-type memory when erasure operation is carried out. Since the withstanding voltage at this time is maintained, it is difficult to make a self-aligned contact.

FIG. 2A is a plan view showing the structure of a memory cell array in a NAND-type flash memory. FIG. 2B is a cross-sectional view of the memory cell array shown in FIG. 2A, cut along the line 2B-2B.

A plurality of memory cells are connected in series, with sources and drains shared between each other, thereby to construct a NAND column. At both ends of the NAND column, selection transistors are provided. Of the selection transistors provided at both ends, a drain or source of one selection transistor is connected to a bit line 208 through a bit-line contact material 207. A drain or source of the other selection transistor is connected to a common source line 210 through a common source line contact material 209.

The memory cells and selection transistors have stacked gates in which charge storage layer 203 and the control gate 205 are layered, like the NOR-type memory cell. The charge storage layer 203 of the selection transistor or the charge storage layer 203 and the control gate 205 are connected to the gate signal line at another portion than the region shown in the figure.

The bit-line contact material 207 has a side end part adjacent to a stacked gate and is constructed in a so-called self-aligned contact structure in which a part of the contact material 207 extends over the stacked gate, at its connecting part to a bit line 208. This structure is adopted to eliminate a dimensional margin between the bit-line contact material 207 and the stacked gate, so that the memory cell array can be downsized. To attain the self-aligned contact structure, the stacked gate is covered with a cap material 211, e.g., a silicon nitride film. In particular, the cap material 211 on the control gate 205 is formed thick on the control gate 205. In this manner, the contact material 207 buried in a contact hole and the control gate 205 are prevented from being short-circuited. A conductive material such as low-resistance poly-silicon or metal material is used for the contact material 207.

Like the bit line contact material 207, the common source line contact material 209 is also constructed in a self-aligned contact structure, in the NAND type memory. This is because only a small potential difference (about 3 V) exists between the common source line 210 and the control gate 205 of the selection transistor adjacent to the source line in the NAND type memory, so there will not appear a problem of dielectric breakdown even if a self-aligned contact is made.

The self-aligned contact structure is adopted to reduce the dimensional margin between the contact material and the gate, thereby to shorten the cell array length in the direction of the bit-line 208. The method of using the self-aligned contact structure to shorten the cell array length is very effective regardless of whether the memory cell is of the NAND type or NOR type.

In accordance with reduction of the design rule, the self-aligned contact structure is considered to have much higher effectiveness as the gate length is shortened. This is because it is difficult to scale variants and the like at the time of lithography, at the same ratio as that of the reduction of the gate length. Therefore, the distance between the contact material and the gate is not reduced to the level as that of the gate length.

Formation of the bit line contact material 207 and the common source line contact material 209 is normally performed as follows. At first, a stacked gate is buried by an inter-layer insulating film 213 such as a BPSG film or the like. Flattening processing is carried out by CMP or the like. The BPSG film is a film which attains an improved melting property by mixing impurities such as boron, phosphors, and the like into a silicon dioxide film.

Thereafter, contact holes are opened by dry etching. When these contact holes are opened, the cap material 211 on the control gate 205 is thinned or is perfectly removed so that the control gate 205 is exposed, if the etching election ratio between the cap material 211 covering the control gate 205 and the inter-layer insulating film 213 is not high. In this case, a short-circuiting defect occurs when a contact material is buried. Therefore, a silicon-dioxide-based film is widely used for the inter-layer insulating film 213, and a silicon-nitride-based film which attains a relatively high selection ratio relative to the silicon-dioxide-based film is widely used for the cap material 211.

However, if the silicon-nitride-based film is formed covering the gate of a transistor, a stack insulating film structure constructed by a gate film mainly made of a silicon dioxide film and a silicon nitride film is formed on the diffusion layer in the side of the gate. Therefore, hot electrons generated at channels during operation of a pentode of a transistor are caught by the inter-layer insulating film interface (the interface between the gate insulating film and the silicon nitride film), causing an electronic trap. It is generally known that modulation of an ON-current of a transistor, change of a threshold voltage, deterioration of a surface junction withstanding voltage, or the like is caused if this electronic trap thus occurs.

The flash memory has a memory cell array and a peripheral circuit. The peripheral circuit is a circuit which generates a signal for driving the memory cell array and is formed outside the region of the memory cell array. This peripheral circuit, for example, generates a control gate signal and a bit-line signal. In many cases, the peripheral transistor is also constructed in a gate structure similar to that of the memory cell, to reduce processing steps and to share processes, in the flash memory described above. Therefore, the peripheral transistor is formed into a shape in which the gate is covered with a cap material and causes deterioration of characteristics at high possibility, like the memory cell and the selection transistor.

To solve this problem, a structure in which a silicon-dioxide-based film is sandwiched between a silicon nitride film and a gate has been proposed. The object of sandwiching a silicon-dioxide-based film between a thin gate insulating film on a diffusion layer and the silicon nitride film is to widen the distance between the diffusion layer and the silicon nitride film to reduce caught hot electrons.

However, it is difficult to realize simultaneously the structure in which a silicon-dioxide-based film is sandwiched between the silicon nitride film and the gate, and the structure self-aligned contact structure described above.

FIGS. 3A, 3B, 4A, and 4B are cross-sectional views showing steps of forming a self-aligned contact in a structure in which a silicon-dioxide-based film is sandwiched between a silicon nitride film and a stacked gate.

After forming a stacked gate, a silicon dioxide film 214 is formed with a thickness of, for example, about 200 Å, on the stacked gate. Further, a silicon nitride film 215 is formed with a thickness of, for example, about 400 Å, on the silicon dioxide film 214. Further, an interlayer insulating film 213 is formed the above-described silicon nitride film 215. Thereafter, as shown in FIG. 3A, the interlayer insulating film 213 is flattened by CMP or the like.

Subsequently, a resist film 216 is applied onto the structure shown in FIG. 3A. Thereafter, as shown in FIG. 3B, a part of the resist film which corresponds to a contact part is opened by a lithography method.

Next, the interlayer insulating film 213 is etched by dry etching, using the resist film 216 as a mask, as shown in FIG. 4A. At this time, the silicon nitride film 215 and the silicon nitride film of the cap material 211 are etched in correspondence with the etching selection ratio between the interlayer insulating film 213 and the silicon nitride film. Generally, etching is concentrated on end parts of the gate, so that the film is reduced more. Therefore, a silicon dioxide film 214 is exposed at a part. In the worst case, the silicon dioxide film 214 can be etched back.

Thereafter, interfacial cleaning is performed on the structure shown in FIG. 4A. Thereafter, a contact material 217, e.g., metal such as a low-resistance polysilicon or tungsten (W) is buried. Further, as shown in FIG. 4B, the contact material 217 is flattened to finish a contact.

In the manufacturing method described above, the silicon dioxide film 214 in the contact hole is etched back. As a result, the contact material 217 (buried-electrode material) enters into the etched-back part, so that the possibility of short-circuiting between the contact material 217 and the control gate 205 rises. Hence, in a conventional technique, it is difficult to use the structure in which the silicon dioxide film 214 is sandwiched between the silicon nitride film 215 and the stacked gate to improve the reliability, together with the self-aligned contact structure.

As another problem in case of using the self-aligned contact structure for the bit-line contact part and the common source line contact part, residual parts of a film on gap parts of an element separation insulating film.

FIG. 5 is a cross-sectional view in case where the memory cell array shown in FIG. 4B is cut along the line 5-5 in FIG. 2A.

As shown in FIG. 5, on the semiconductor region sandwiched by the element separation insulation films 217, the bit-line contact material 207 and the semiconductor region are electrically connected with each other. On the side surfaces in both sides of the element separation insulating film 217, the silicon dioxide film 214 and the silicon nitride film 215 remain like spacers. These residues greatly reduce the contact area between the bit-line contact material 207 and the semiconductor region. Reduction of the contact area involves effective lowering of the cell current, so that the silicon nitride film 215 on the semiconductor region must be perfectly removed when opening the contact hole.

On the other hand, however, the silicon nitride film 215 on the control gate 205 must be left for a self-aligned contact. Thus, there is a trade-off that the silicon nitride film 215 on the semiconductor region must be removed while the silicon nitride film 215 on the control gate 205 must be left, so that the processing margin greatly decreases.

The above problem is conspicuous particularly when the element separation insulating film 217 is formed to be higher than the semiconductor region. If element separation is carried out with use of a self-alignment STI (Shallow Trench Isolation) method, the element separation insulating film 217 is formed to be higher than the semiconductor substrate, so that its influence is greater than an element separation structure based on a LOCOS method. The above-described self-alignment STI method is a method of forming an element separation region with use of a shallow trench formed by a self-alignment method. More specifically, in this method, a trench is formed after depositing a charge storage layer. Further, an insulating material is buried in the trench, thereby to form an element separation structure.

Also, if low-resistance polysilicon is used as a contact material to be buried in the bit-line contact hole, there is a characteristic that ohmic contact is obtained between the contact material and the semiconductor region, without using a barrier metal material such as Ti, TiN, or the like as a buffer film and without causing the problem of abnormal contact resistance or increase of junction leakage even when the impurity density of the semiconductor region (diffusion layer) is relatively low.

Therefore, the contact resistance increases to be greater than in the case of using metal material for the contact material. However, there is a case that the contact part using the same buried material as that of the bit-line contact part is used for a peripheral transistor forming part of a peripheral circuit, for the purpose of reducing the dimensional margin between the contact material and the semiconductor region, to down-size the elements.

In this case, the contact hole of the high-withstanding-voltage-based transistor needs to be opened at the same time when the contact hole of the bit-line contact part is opened. However, the gate insulating film of the high-withstanding-voltage-based transistor is much thicker, compared with the memory cell. For example, the film thickness of the gate insulating film of the high-withstanding-voltage-based transistor is 150 Å to 200 Å in case of an NOR-type flash memory or 300 Å to 400 Å in case of an NAND-type flash memory, in relation to the film thickness of the gate insulating film of the memory cell which is about 100 Å. Therefore, the silicon nitride film on the diffusion layer needs to be opened, and further, the gate insulating film needs to be etched by 150 Å to 400 Å, to open perfectly a contact hole in the diffusion layer of the high-withstanding-voltage-based transistor.

However, if additional etching is carried out, a defect occurs in that the film of the cap material on the control gate is reduced at the bit-line contact part or the element separation film partially overlapping the contact part is etched back. That is, in case where a self-aligned contact structure is adopted to form the bit-line contact part, there is a problem that it is very difficult to form the contact part of a peripheral transistor through the same process as that of forming the bit-line contact part.

As has been described above, there is a problem that techniques which have been conventionally proposed cannot be used in case where the bit-line contact part is constructed in a self-aligned contact structure. That is, a conventional non-volatile semiconductor memory device has a problem in that the above-described techniques for attaining high reliability and for downsizing peripheral transistors cannot be used if a self-aligned contact structure is adopted at the bit-line contact part.

BRIEF SUMMARY OF THE INVENTION

According to an aspect of the present invention, a non-volatile semiconductor memory device comprises: a semiconductor body of a first conductivity type; first and second semiconductor regions of a second conductivity type, formed apart from each other on the semiconductor body; a stacked gate formed with a gate insulating film inserted thereunder, on the semiconductor body between the first and second semiconductor regions, the stacked gate having a first side surface, a second side surface opposed to the first side surface, and an upper surface; an interlayer insulating film formed above the semiconductor body; a contact material buried to be adjacent to the first side surface of the stacked gate, in the interlayer insulating film, the contact material contacting the first semiconductor region; a first insulating film formed on the second side surface and the upper surface, except the first side surface of the stacked gate adjacent to the contact material; and a second insulating film formed on the first side surface adjacent to the contact material, and the first insulating film.

BRIEF DESCRIPTION OF THE SEVERAL VIEWS OF THE DRAWING

FIGS. 9A and 9B are cross-sectional views of a main second step, showing a method of manufacturing the NAND-type memory cell according to the second embodiment;

DETAILED DESCRIPTION OF THE INVENTION

In the following, embodiments of the present invention will be explained with reference to the drawings.

First Embodiment

At first, explanation will be made of a NOR-type non-volatile semiconductor memory device as a first embodiment of the present invention.

Figure 6A:
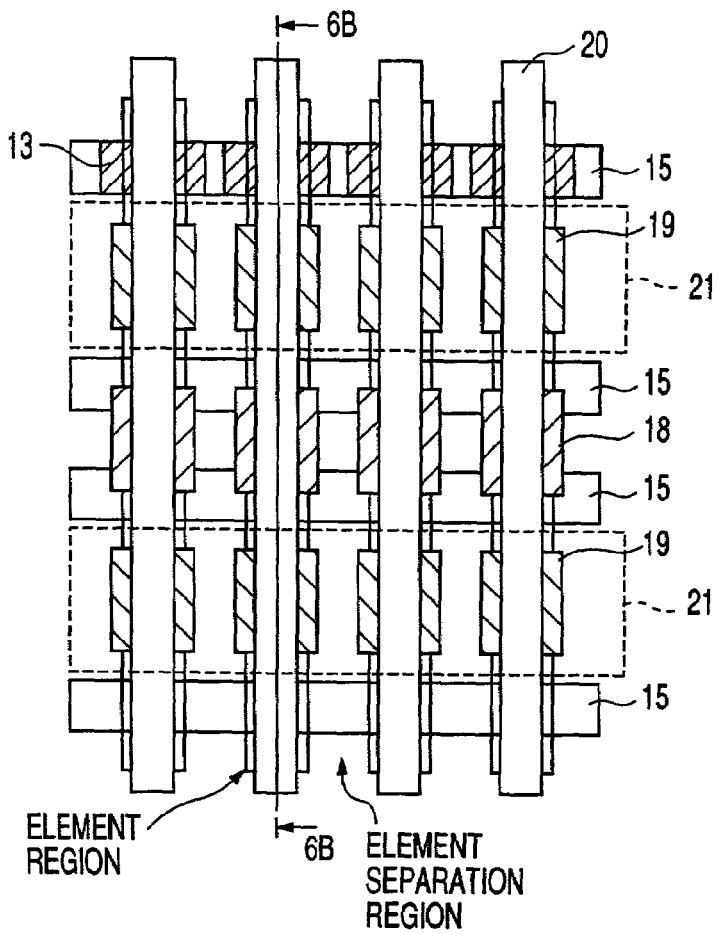
FIG. 6A is a plan view showing the structure of a memory cell array in a NOR-type non-volatile semiconductor memory device according to the first embodiment of the present invention.
Figure 6B:
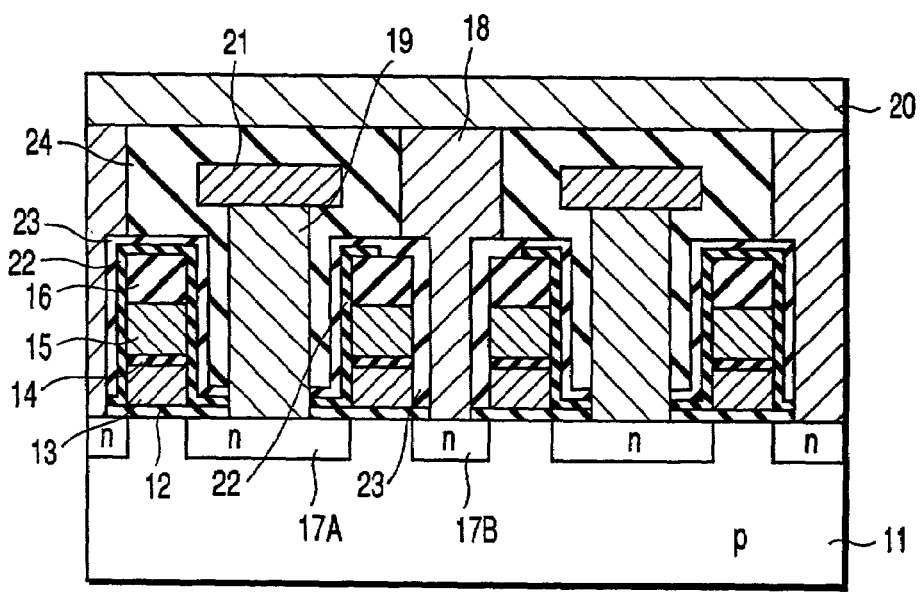
FIG. 6B is a cross-sectional view showing the memory cell array in the NOR-type non-volatile semiconductor memory device according to the first embodiment, cut along the line 6B-6B.

FIG. 6A is a plan view showing the structure of a memory cell array in the NOR-type non-volatile semiconductor memory device according to the first embodiment of the present invention. FIG. 6B is a cross-sectional view showing the memory cell array shown in FIG. 6B, cut along the line 6B-6B.

A trench for separating an element is formed in a p-type silicon semiconductor substrate (or p-type well) 11, and an element separation insulating material such as a silicon dioxide material is buried in the trench. In this manner, an element separation region where a silicon dioxide material is buried and an element region separated by the element separation region, where no silicon dioxide material is buried are formed. A thin tunnel insulating film 12 where a tunnel current can flow is formed on the entire surface of the channel region in the element region inside the semiconductor substrate.

A charge storage layer 13 is formed on the tunnel insulating film 12. This charge storage layer 13 is formed such that side end parts are aligned with the element separation region. The charge storage layer 13 partially extends over the element separation region and is cut above the element separation region, such that memory cells are separated from each other. A control gate 15 is formed on the charge storage layer 13 through an inter-gate insulating film 14.

A gate cap film 16 is formed on the control gate 15. This gate cap film 16 is made of, for example, a silicon nitride film. The gate cap film 16 and the control gate 15 are processed to be vertical to the surface of the semiconductor substrate, in a self-alignment manner, such that the side end parts of the film 16 are aligned with the charge storage layer 13. A stacked gate is formed by the charge storage layer 13, the control gate 15, and the gate cap film 16. Formed in both sides of the stacked gate in the semiconductor substrate 11 are a source region 17A and a drain region 17B doped with impurities of the conductivity type different from the p-type semiconductor substrate (or p-type well) 11 in the channel region. The source regions 17A and drain region 17B are formed of an n-type diffusion layer.

A bit-line contact material 18 connected with the drain region 17B is formed on the drain region 17B. A common source line contact material 19 connected to the source region 17A is formed on the source region 17A. The bit line contact material 18 and the common source line contact material 19 are made of low-resistance polysilicon, metal material, or the like which is conductive material. The upper parts of the contact materials 18 and 19 are each flattened. The bit-line contact material 18 is connected to a bit line 20 made of a metal electrode. The common source contact material 19 is connected to the common source line 21.

The stacked gate of the memory cell is covered with a gate barrier film 22 made of a silicon dioxide film. Further, a contact barrier film 23 made of a silicon nitride film covers the gate barrier film 22.

From the side surface of the stacked gate adjacent to the bit-line contact material 18, the gate barrier film 22 is removed as shown in FIG. 6B. The structure is therefore arranged such that this side surface is directly covered with the contact barrier film 23. In other words, the gate barrier film 22 is formed on the side surface of the stacked gate adjacent to the common source line contact material 19, and the contact barrier film 23 is further formed on the gate barrier film 22. Meanwhile, the gate barrier film 22 is not formed on the side surface of the stacked gate adjacent to the bit-line contact material 18, but the contact barrier film 23 is formed directly on this side surface.

As shown in FIG. 6B, an interlayer insulating film 24, e.g., a BPSG film or the like is formed on the semiconductor substrate 11.

The source line contact material 19 is provided with a predetermined distance maintained from the contact barrier film 23 formed on the side surface of the stacked gate. The bit line contact material 18 is provided in contact with the contact barrier film 23 formed on the side surface of the stacked gate, without maintaining any distance.

Further, the bit line contact material 18 is formed so as to extend partially over the contact barrier film 23 on two stacked gates provided to be adjacent to each other. This bit line contact material 18 is formed to be buried between contact barrier films (silicon nitride films) 23 on adjacent gates, on the semiconductor substrate 11. The structure of the part of the bit line contact material 18 is constructed into a self-aligned contact structure. This self-aligned contact structure is formed through the steps described below. Using a contact barrier film 23 and a gate cap film 16 as masks, a contact hole 18 is formed by self-aligning process. Thereafter, a contact material is buried in the contact hole, to form a bit-line contact material 18. In practice, the bit-line contact material 18 is filled in the contact hole between stacked gates, in which a part of the gate cap film 16 made of a silicon nitride film and a part of the contact barrier film 23 are etched.

In the NOR-type memory cell shown in this embodiment, a self-aligned contact structure is used to reduce the space between the bit-line contact material 18 and the stacked gates as much as possible, in the side of the bit-line contact material 18. Thus, the memory cell array is downsized.

Meanwhile, in the side of the source line contact material 19, the withstanding voltage between the common source line contact material 19 and the stacked gate is maintained without adopting a self-aligned contact structure. During operation of erasing data stored in the memory cell, a high voltage is applied between the source region 17A and the control gate 15, and therefore, it is difficult to use a self-aligned contact structure in which no withstanding voltage is maintained.

Also, change of the electric characteristic in the memory cell is reduced by forming a gate barrier film 22 on the side surface of the stacked gate and the surface of the gate insulating film 12 which are the common source line contact material 19. By covering the surface of the gate insulating film 12 with the gate barrier film 22, hot carriers (mainly positive holes) generated between the source region 17A and the semiconductor substrate 11 by a high voltage applied during erasure operation are prevented from being injected into the gate insulating film 12 and being caught between the gate insulating film 12 and the contact barrier film 23.

The film thickness of the gate barrier film 22 needs to be about 100 Å to 200 Å thick in order to prevent hot carriers being injected by tunneling. The film thickness of the contact barrier film 23 needs to be, for example, about 200 Å to 400 Å thick, in consideration of the etching selection ratio when forming a contact hole by self-alignment.

Although a silicon dioxide film is used as the gate barrier film 22, another oxide-based insulating film may be used. The another oxide-based insulating film may be, for example, a metal oxide film such as an aluminum oxide film ($Al_2O_3$ or the like), a tantalum oxide film ($Ta_3O_5$ or the like), or the like. Although a silicon nitride film is used as the contact barrier film 23, another nitride-based insulating film may be used.

Figure 1A:
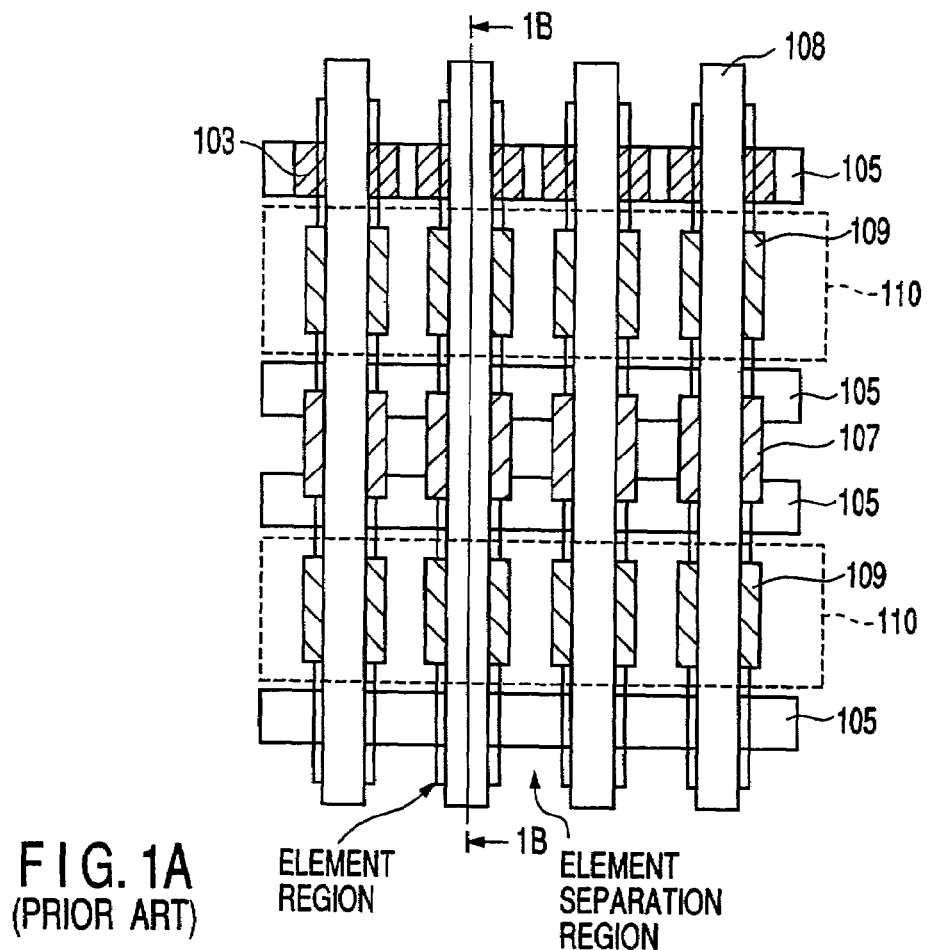
FIG. 1A is a plan view showing the structure of a memory cell array in a conventional NOR-type flash memory.
Figure 1B:
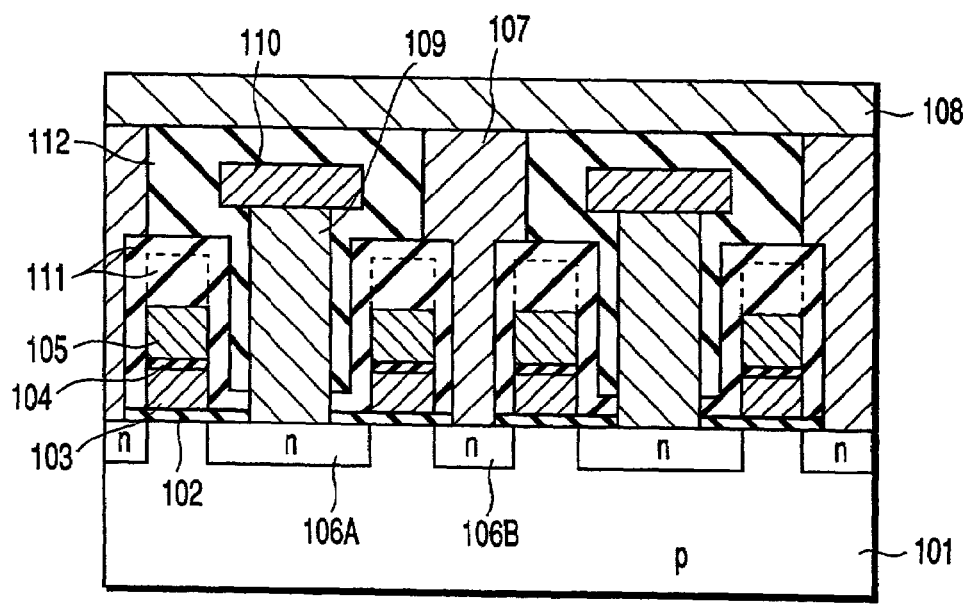
FIG. 1B is a cross-sectional view showing the memory cell array, cut along the line 1B-1B.
Figure 2A:
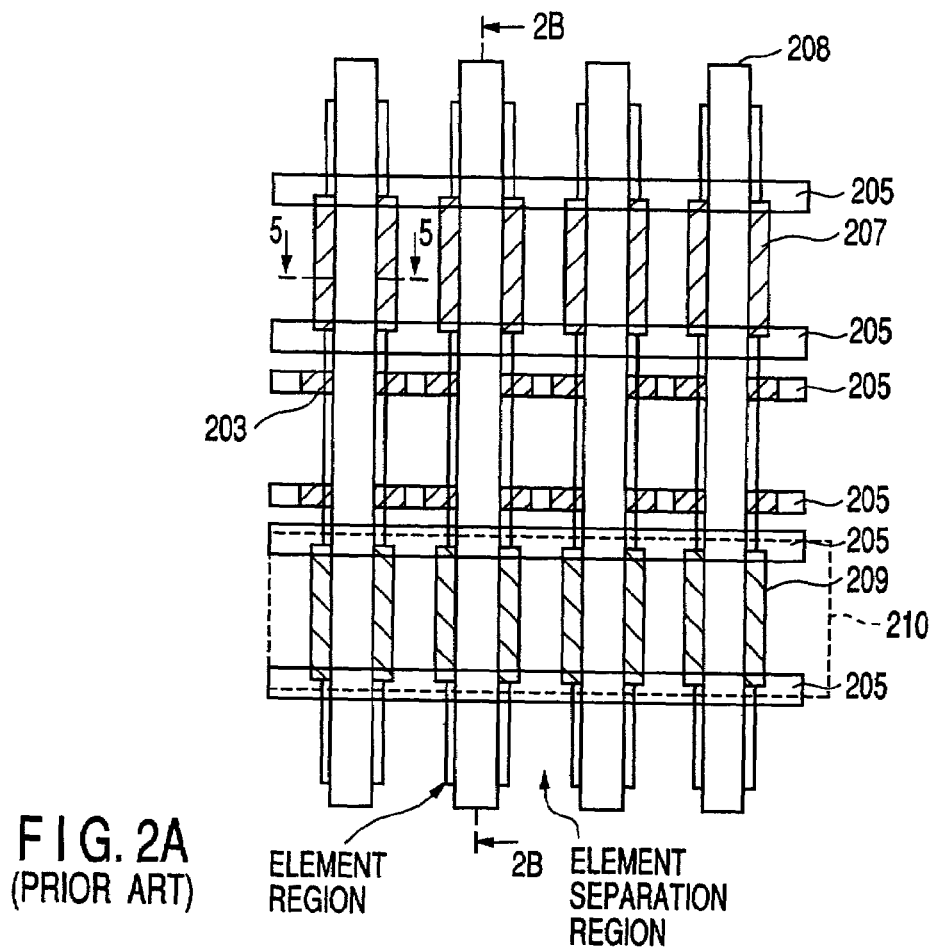
FIG. 2A is a plan view showing the structure of a conventional NAND-type flash memory.
Figure 2B:
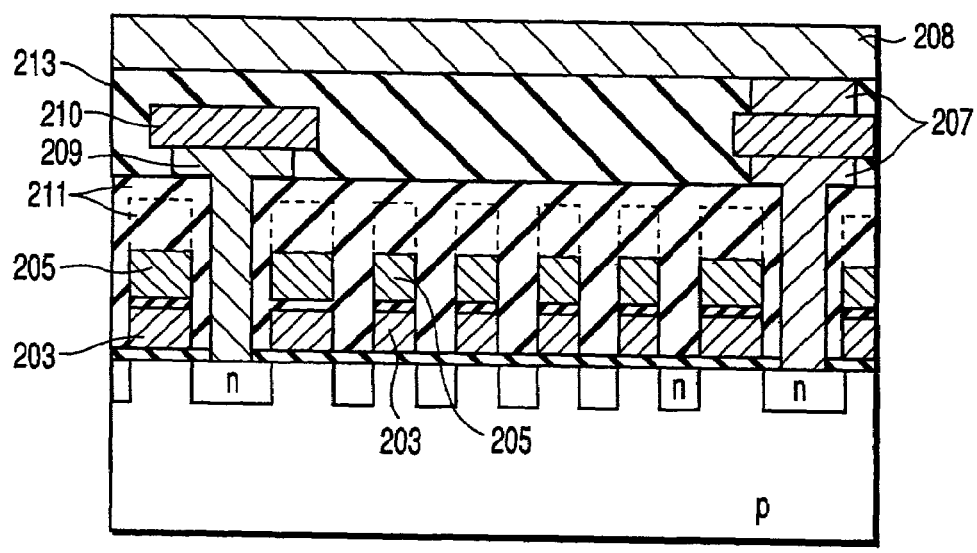
FIG. 2B is a cross-sectional view of the memory cell array, cut along the line 2B-2B.
Figure 3A:
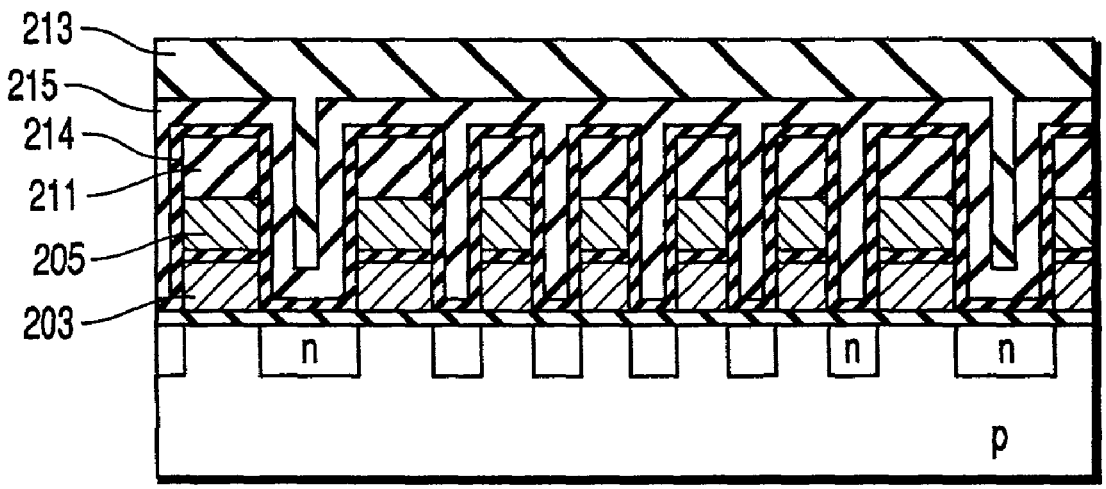
FIGS. 3A and 3B are cross-sectional views showing a first step of forming a self-aligned contact in a NAND-type memory cell array having a structure in which a silicon dioxide film is sandwiched between a silicon nitride film and a stacked gate.
Figure 3B:
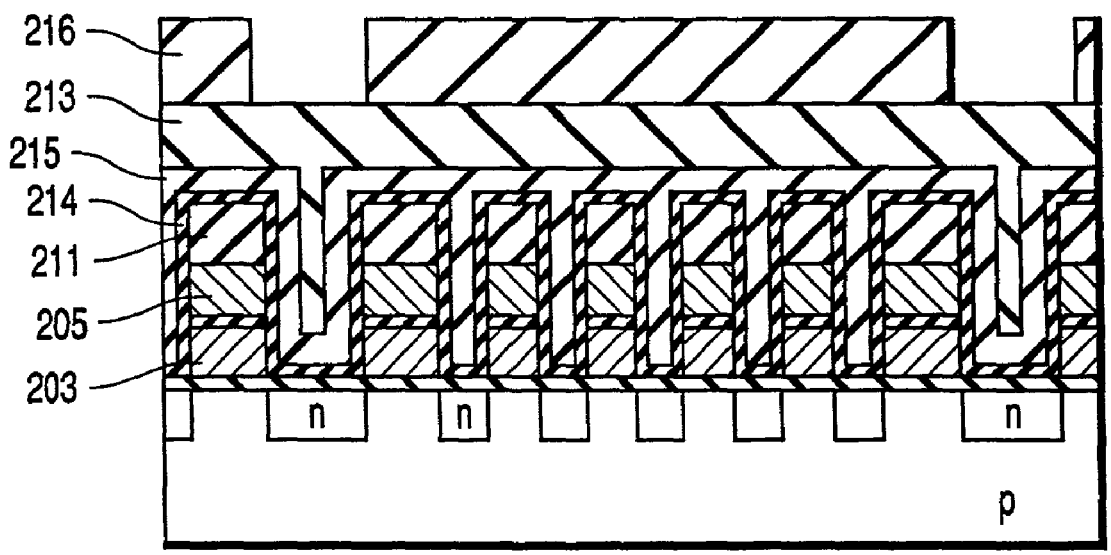
Figure 4A:
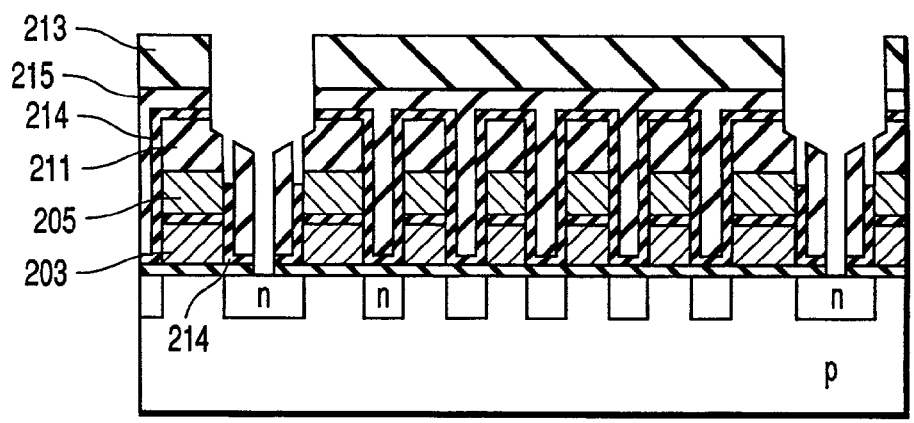
FIGS. 4A and 4B are cross-sectional views showing a second step of forming a self-aligned contact in the NAND-type memory cell array having the structure sandwiching a silicon dioxide film.
Figure 4B:
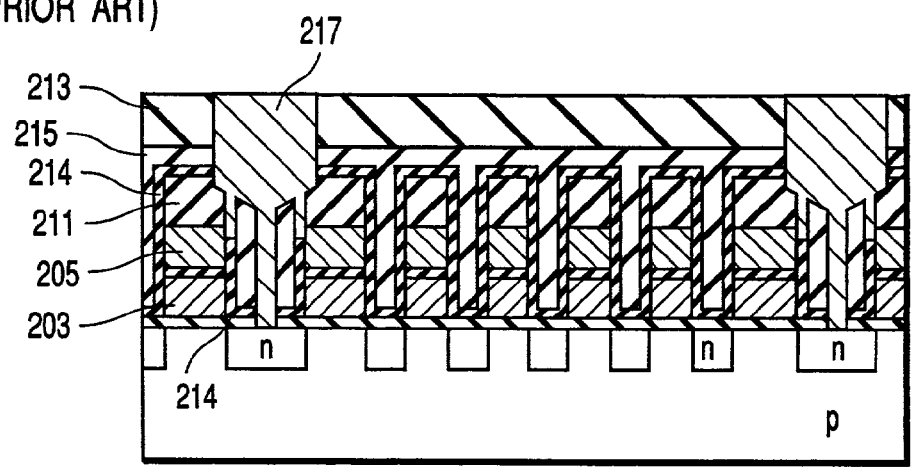

According to the NOR-type non-volatile semiconductor memory device as the first embodiment, the gate barrier film (a silicon dioxide film) 22 is not formed on the side surface of stacked gate, which is adjacent to the bit-line contact material 18, when forming a contact hole at the bit-line contact part having a self-aligned contact structure. Therefore, the contact material does not enter into the cavity area where the gate barrier film is etched, as shown in FIG. 4B. It is thus possible to prevent the contact material and the control gate from being short-circuited.

Further, the gate barrier film (silicon dioxide film) 22 is formed between the gate insulating film 12 and the contact barrier film (silicon nitride film) 23 which are adjacent to the source region 17A. Therefore, it is possible to reduce hot carriers caught between the gate insulating film 12 and the contact barrier film 23.

Second Embodiment

Next explanation will be made of an NAND-type non-volatile semiconductor memory device according to a second embodiment of the present invention.

Figure 7A:
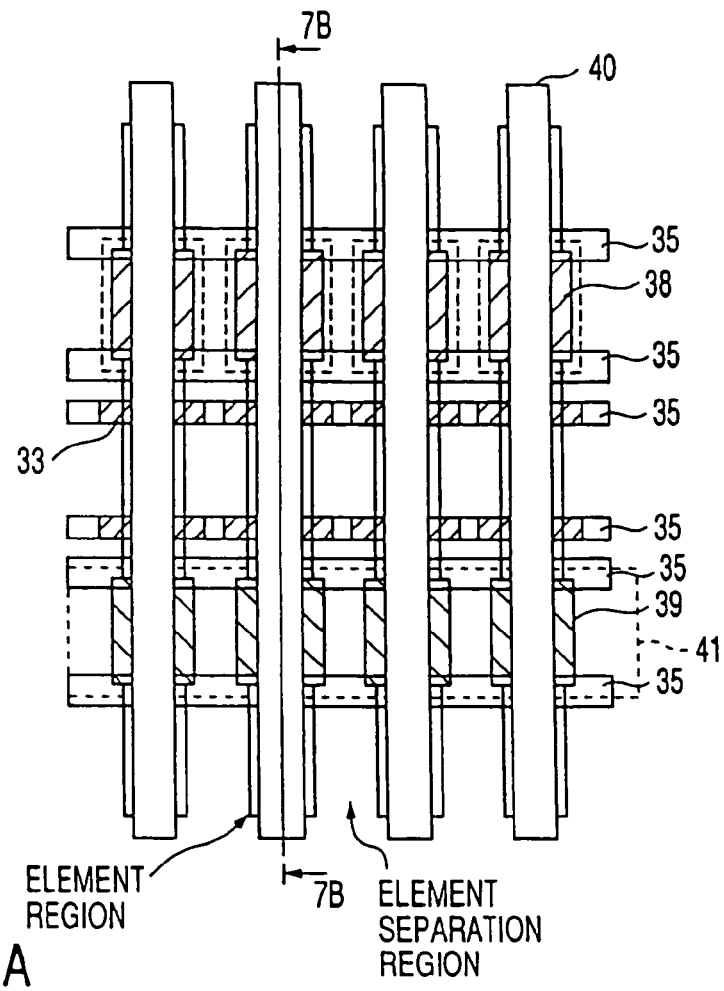
FIG. 7A is a plan view showing the structure of a memory cell array in a NAND-type non-volatile semiconductor memory device according to the second embodiment of the present invention.
Figure 7B:
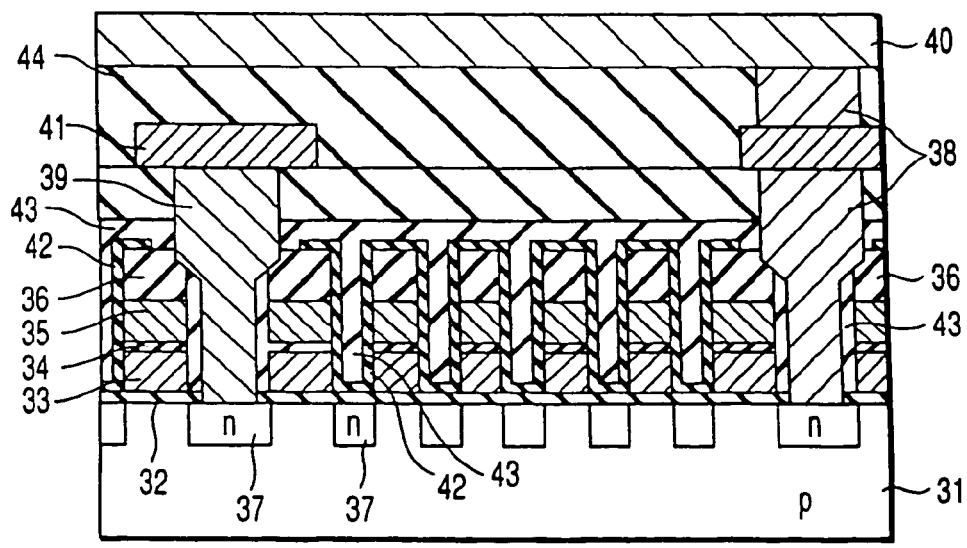
FIG. 7B is a cross-sectional view showing the memory cell array in the NAND-type non-volatile semiconductor memory device according to the first embodiment, cut along the line 7B-7B.

FIG. 7A is a plan view showing the structure of a memory cell array in the NAND-type non-volatile semiconductor memory device according to the second embodiment. FIG. 7B is a cross-sectional view of the memory cell array cut along a line 7B-7B.

A trench for separating an element is formed in a p-type silicon semiconductor substrate (or p-type well) 31, and an element separation insulating material such as a silicon dioxide material is buried in the trench. In this manner, an element separation region where a silicon dioxide material is buried and an element region separated by the element separation region, where no silicon dioxide material is buried are formed. A thin tunnel insulating film 32 where a tunnel current can flow is formed on the entire surface of the channel region in the element region inside the semiconductor substrate.

A charge storage layer 33 is formed on the tunnel insulating film 32. This charge storage layer 33 is formed such that side end parts are aligned with the element separation region. The charge storage layer 33 partially extends over the element separation region and is cut above the element separation region, such that memory cells are separated from each other. A control gate 35 is formed on the charge storage layer 13 through an inter-gate insulating film 34.

A gate cap film 36 is formed on the control gate 35. This gate cap film 36 is made of, for example, a silicon nitride film. The gate cap film 36 and the control gate 35 are processed to be vertical to the surface of the semiconductor substrate, in a self-alignment manner, such that the side end parts thereof are aligned with the charge storage layer 33. A stacked gate is formed by the charge storage layer 33, the control gate 35, and the gate cap film 36. Formed in both sides of the stacked gate in the semiconductor substrate 31 is an n-type diffusion layer 37 doped with impurities of the conductivity type different from the p-type semiconductor substrate (or p-type well) 31 in the channel region. The n-type diffusion layer 37 forms a source or drain.

A plurality of stacked gates are provided and connected in series so as to share the n-type diffusion layer 37. A bit-line contact material 38 and a common source-line contact material 39 are formed on each of the n-type diffusion layer 37 at the end of the stacked gates connected in series. The stacked gate adjacent to the contact materials 38 and 39 operates as a selection transistor. At the selection transistor, the charge storage layer 33 and the control gate 35 are short-circuited, so that a signal is directly applied to the charge storage layer 33. A plurality of stacked gates sandwiched between selection transistors operate as memory cells.

The bit line contact material 38 and the common source line contact material 39 are made of low-resistance polysilicon, metal material, or the like which is conductive material. The upper parts of the contact materials 38 and 39 are each flattened. The bit-line contact material 38 is connected to a bit line 40 made of a metal electrode. The common source contact material 39 is connected to the common source line 41.

The stacked gate of the memory cell and the stacked gate of the selection transistor are covered with a gate barrier film 42 made of a silicon dioxide film. Further, a contact barrier film 43 made of a silicon nitride film covers the gate barrier film 42.

In the stacked gate of the selection transistor adjacent to the bit-line contact material 38, the gate barrier film 42 is removed from the side surface adjacent to the bit-line contact material 38. The structure is therefore constructed in a structure in which the side surface is directly covered with the contact barrier film 43.

Also, in the stacked gate of the selection transistor adjacent to the common source line contact material 39, the gate barrier film 42 is removed from the side surface adjacent to the common source line contact material 39. The structure is therefore constructed in a structure in which the side surface is directly covered with the contact barrier film 43.

In other words, the gate barrier film 42 is formed on the side surface of the stacked gate which is adjacent to the memory cell, and the contact barrier film 43 is further formed on the gate barrier film 42. However, the gate barrier film 42 is not formed on the side surface of the stacked gate of the selection transistor, which is adjacent to the bit-line contact material 38 or the common source line contact material 39, but the contact barrier film 43 is formed directly on this side surface.

As shown in FIG. 7B, an interlayer insulating film 44, e.g., a BPSG film or the like is formed on the semiconductor substrate 31.

The bit line contact material 38 is provided so as to contact the contact barrier film 43 formed on the side surface of the stacked gate of the selection transistor, without maintaining any distance therebetween.

Further, the bit line contact material 38 is formed so as to extend partially over the stacked gates in both sides. This bit line contact material 38 is formed to be buried between contact barrier films (silicon nitride films) 43 on adjacent gates, on the semiconductor substrate 31. The structure of the part of the bit line contact material 38 is constructed into a self-aligned contact structure. This self-aligned contact structure is formed through the steps described below. Using a contact barrier film 43 and a gate cap film 36 as masks, a contact hole is formed by self-aligning process. Thereafter, a contact material is buried in the contact hole, to form a bit-line contact material 38. In practice, as shown in FIG. 7B, the bit-line contact material 38 is filled in the contact hole between stacked gates, in which a part of the gate cap film 36 made of a silicon nitride film and a part of the contact barrier film 43 are etched.

Likewise, the source line contact material 39 is provided so as to contact the contact barrier film 43 formed on the side surface of the stacked gate of the selection transistor, with not distance maintained therebetween. Further, the common source line contact material 39 is formed so as to extend partially over the stacked gates in both sides. This common source line contact material 39 is formed to be buried between contact barrier films (silicon nitride films) 43 on gates of selection transistors adjacent to each other, on the semiconductor substrate 31. The structure of the part of the common source line contact material 39 is constructed through the steps described below. Using the contact barrier film 43 and the gate cap film 36 as masks, a contact hole is formed by self-aligning process. Thereafter, a contact material is buried in the contact hole, to form a common source line contact material 39. In practice, as shown in FIG. 7B, the common source line contact material 39 is filled in the contact hole between stacked gates, in which a part of the gate cap film 36 and a part of the contact barrier film 43 are etched.

In the NAND-type memory cell shown in this embodiment, the stacked gate of the memory cell is covered with the gate barrier film 42 made of a silicon dioxide film, and the gate barrier film 42 is covered with the contact barrier film 43 made of a silicon nitride film. Meanwhile, the stacked gate of the selection transistor has a structure in which the side surface which is adjacent to the contact material 38 or 39 is not covered with the gate barrier film 42 but is directly covered with the contact barrier film 43.

The stacked gate of the memory cell is covered with the gate barrier film 42 and the gate barrier film 42 is formed on the gate insulating film 32 between the stacked gates because hot carriers (mainly positive holes) generated between the source region 17A and the semiconductor substrate 11 by a high voltage applied during erasure operation can be prevented from being injected into the gate insulating film 12 and being between the gate insulating film 12 and the contact barrier film 23, like the case of the NOR-type memory cell according to the first embodiment.

The film thickness of the gate barrier film 22 needs to be about 100 Å to 200 Å thick in order to prevent hot carriers being injected by tunneling. The film thickness of the contact barrier film 43 needs to be, for example, about 200 Å to 400 Å thick, in consideration of the etching selection ratio when forming a contact hole by self-alignment.

Although a silicon dioxide film is used as the gate barrier film 42, another oxide-based insulating film may be used. The another oxide-based insulating film may be, for example, a metal oxide film such as an aluminum oxide film ($Al_2O_3$ or the like), a tantalum oxide film ($Ta_3O_5$ or the like), or the like. Although a silicon nitride film is used as the contact barrier film 43, another nitride-based insulating film may be used.

According to the NAND-type non-volatile semiconductor memory device as the second embodiment having the structure as described above, the gate barrier film (a silicon dioxide film) 42 is not formed on the side surface of stacked gate, which is adjacent to the bit-line contact material 38, when forming a contact hole at the bit-line contact material 38 (or the common source line contact material 39) having a self-aligned contact structure. Therefore, the contact material does not enter into the cavity area where the gate barrier film is etched. It is thus possible to prevent the contact material and the control gate from being short-circuited.

Further, the gate barrier film (silicon dioxide film) 42 is formed between the gate insulating film 32 in both sides of the stacked gate of the memory cell (on the n-type diffusion layer 37 forming a source or drain) and the contact barrier film (silicon nitride film) 43. Therefore, it is possible to reduce hot carriers caught between the gate insulating film 32 and the contact barrier film 43. The electric characteristics of the memory can hence be prevented from being changed due to influences from caught hot carriers.

Next explanation will be made of a method of manufacturing the NAND-type memory cell.

FIGS. 8A, 8B, 9A, and 9B are cross-sectional views showing main steps of the method of manufacturing the NAND-type memory cell.

Figure 8A:
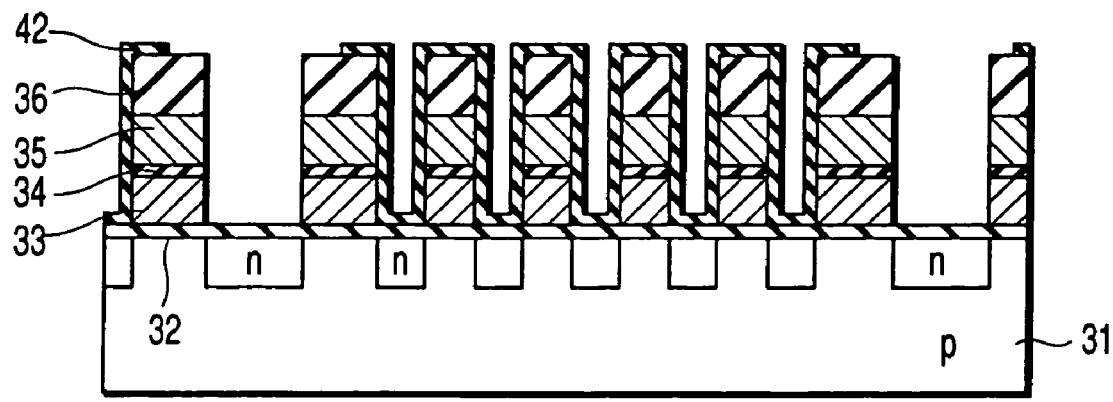
FIGS. 8A and 8B are cross-sectional views of a main first step, showing a method of manufacturing the NAND-type memory cell according to the second embodiment.
Figure 8B:
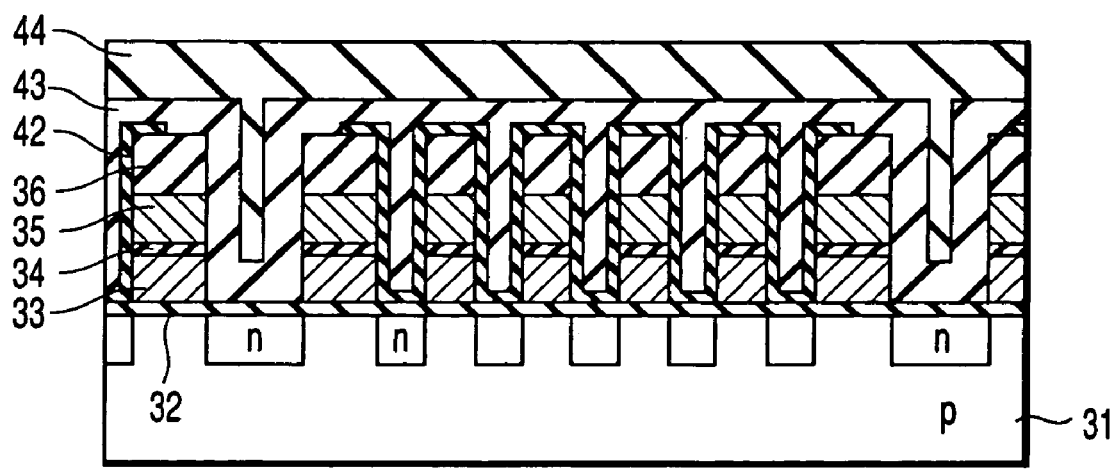

As shown in FIG. 8A, a silicon nitride film to form the contact barrier film 43 when opening a contact hole is deposited as shown in FIG. 8B. Further, an interlayer insulating film (e.g., BPSG film) 44 is formed on the contact barrier film 32. Thereafter, the interlayer insulating film 44 is melted by thermal annealing, and thereafter, the interlayer insulating film 44 is flattened, for example, by CMP or the like.

Next, as shown in FIG. 9A, a contact hole is opened by lithography and dry etching. At this time, a part of the gate cap film (silicon nitride film) 36 is etched in correspondence with the etching selection ratio between the interlayer insulating film (BPSG film) 44 and the contact barrier film (silicon nitride film) 43.

Subsequently, interface cleaning processing such as hydrofluoric acid (HF) processing or the like is carried out. Thereafter, for example, metal such as low-resistance polysilicon or tungsten (W) to form the contact material is buried, as shown in FIG. 9B. Further, the contact material is polished and flattened, thereby to form the bit-line contact material 38 and the common source line contact material 39.

In this method of manufacturing a NAND-type memory cell, the gate barrier film 42 on the side surface of the stacked gate, which is adjacent to the bit-line contact material or the common source line contact material 39, is previously pealed. In this manner, when opening a contact hole, the gate barrier film 42 is exposed and the gate barrier film 42 is locally etched back. Thereafter, when contact material is buried, the contact material and the control gate 35 are prevented from being short-circuited.

Third Embodiment

Next explanation will be made of a NAND-type non-volatile semiconductor memory device as a third embodiment of the present invention. In the second embodiment, all of the gate barrier film 42 which covers the side surface of the stacked gate adjacent to the contact material 38 or 39 is peeled off. In the present third embodiment, however, dry-etching conditions are optimized to remove only the gate barrier film 42 covering the side surface of the gate cap film 36.

Figure 10:
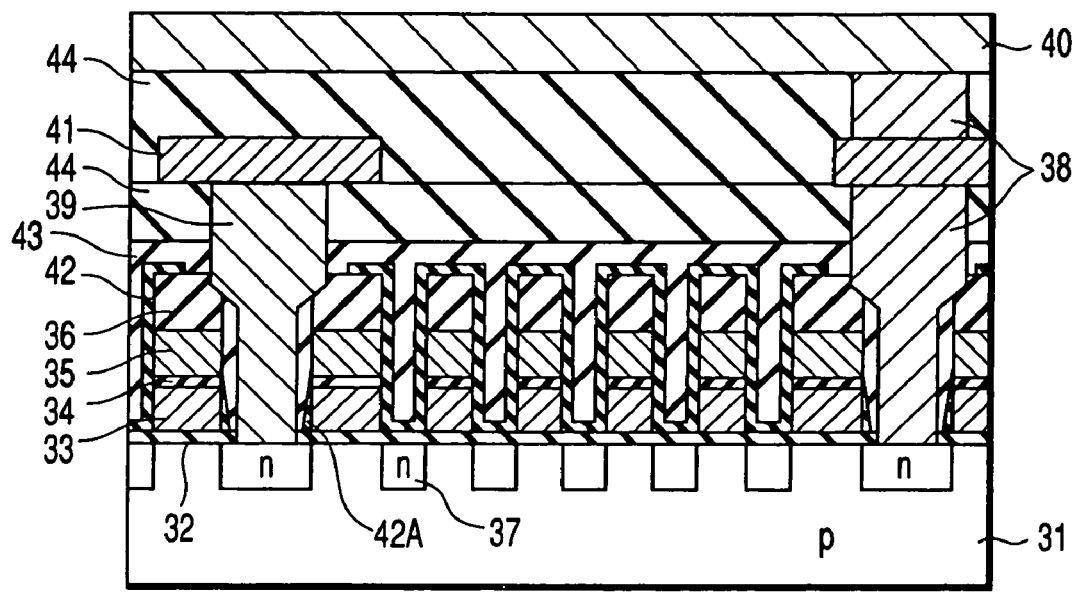
FIG. 10 is a cross-sectional view showing a memory cell array in a NAND-type non-volatile semiconductor memory device according to the third embodiment of the present invention.

FIG. 10 is a cross-sectional view showing a memory cell array in the NAND-type non-volatile semiconductor memory device according to the third embodiment.

As shown in FIG. 10, the gate barrier film 42A covering the side surface of the stacked gate, which is adjacent to the contact material 38 or 39, covers only all areas of the side surface of the charge storage layer 33 and the side surface of the inter-gate insulating film 34, and a part of the side surface of the control gate 35. The other points of the structure are the same as those of the second embodiment.

To form the structure as shown in FIG. 10, the gate barrier film 42A covering the side surface of the stacked gate needs only to shift back to the side surface of the control gate 35 by optimizing dry-etching conditions when opening a contact hole.

Also, in the third embodiment having this structure, the gate barrier film (silicon dioxide film) 42A is not formed on the side surface of the gate cap film 36 which is adjacent to the bit-line contact material 38 (or the common source line contact material 39). Therefore, the gate barrier film 42A is not exposed when forming a contact hole. Accordingly, no contact material enters into the cavity region in the exposed gate barrier film 42, which is exposed to and etched by an etching agent, when a contact hole is formed. The contact material and the control gate can thus be prevented from being short-circuited.

Further, the gate barrier film (silicon dioxide film) 42A is formed between the contact barrier film 43 and the gate insulating film 32 in both sides of the stacked gate of the selection transistor and the memory cell (on the n-type diffusion layer 37). It is therefore possible to reduce hot carriers caught between the gate insulating film 32 and the contact barrier film 43. In this manner, electric characteristics can be prevented from being changed by influences from the caught hot carriers.

Although a silicon dioxide film is used as the gate barrier film 42A, another oxide-based insulating film may be used. The another oxide-based insulating film may be, for example, a metal oxide film such as an aluminum oxide film ($Al_2O_3$ or the like), a tantalum oxide film ($Ta_3O_5$ or the like), or the like.

Fourth Embodiment

Next explanation will be made of a NAND-type non-volatile semiconductor memory device according to the fourth embodiment of the present invention. In the third embodiment described above, only the gate barrier film covering the side surface of the gate cap film 36 of the selection transistor, which is adjacent to the contact material 38 or 39, is removed. In the present fourth embodiment, the gate barrier film 42 covering the side surfaces of the gate cap films 36 of both the selection transistor and the memory cell is removed.

Figure 11:
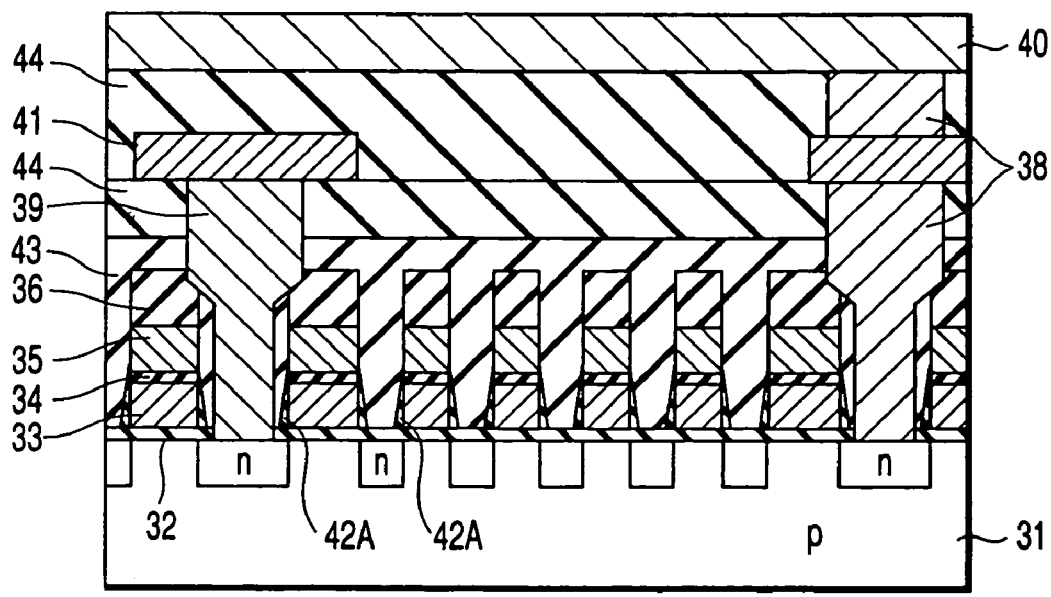
FIG. 11 is a cross-sectional view showing a memory cell array in a NAND-type non-volatile semiconductor memory device according to the fourth embodiment of the present invention.

FIG. 11 is a cross-sectional view of a memory cell array in the NAND-type non-volatile semiconductor memory device according to the fourth embodiment.

As shown in FIG. 11, the gate barrier film 42A covering the side surface of the stacked gate, which is adjacent to the contact material 38 or 39, covers all areas of the side surface of the charge storage layer 33 and the side surface of the inter-gate insulating film 34, and only a part of the side surface of the control gate 35. Further, the gate barrier film 42A covering the side surface of the stacked gate of the memory cell covers all areas of the side surface of the charge storage layer 33 and the side surface of the inter-gate insulating film 34, and only a part of the side surface of the control gate 35. The other points of the structure are the same as those of the second embodiment.

To form the structure as shown in FIG. 11, dry-etching conditions need to be optimized without using lithography, and the gate barrier film 42 covering the side surface of the gate cap film 36 of the selection transistor and the gate barrier film 42 covering the side surface of the gate cap film 36 of the stacked gate of the memory cell need to be etched simultaneously. Further, the gate barrier film 42 needs to shift back to the side surface of the control gate 35.

Also, in the fourth embodiment having this kind of structure, the gate barrier film (silicon dioxide film) 42A is not formed on the side surface of the gate cap film 36 which is adjacent to the bit-line contact material 38 (or the common source line contact material 39). Therefore, the gate barrier film 42A is not exposed when forming a contact hole. Accordingly, no contact material enters into the cavity region in the exposed gate barrier film 42, which is exposed to and etched by an etching agent, when a contact hole is formed. The contact material and the control gate 35 can thus be prevented from being short-circuited.

Further, the gate barrier film (silicon dioxide film) 42A is formed between the contact barrier film 43 and the gate insulating film 32 in both sides of the stacked gate of the selection transistor and the memory cell (on the n-type diffusion layer 37 forming a source or drain). It is therefore possible to reduce hot carriers caught between the gate insulating film 32 and the contact barrier film 43. In this manner, electric characteristics can be prevented from being changed by influences from the caught hot carriers.

Although a silicon dioxide film is used as the gate barrier film 42A, another oxide-based insulating film may be used. The another oxide-based insulating film may be, for example, a metal oxide film such as an aluminum oxide film (Al$_2$O$_3$ or the like), a tantalum oxide film (Ta$_3$O$_5$ or the like), or the like.

Fifth Embodiment

Next explanation will be made of a NAND-type non-volatile semiconductor memory device according to the fifth embodiment of the present invention. The fifth embodiment has been proposed to solve the following two problems. One is a problem that the contact area between the bit-line contact material and the semiconductor substrate is greatly reduced. Another is a problem that the bit-line contact part and the contact part of a peripheral transistor cannot be formed by one same step.

The non-volatile semiconductor memory device according to the fifth embodiment has a memory cell array and a peripheral circuit. The peripheral circuit has a plurality of peripheral transistors and serves to control the operation of the memory cell array. More specifically, the peripheral circuit controls the signals supplied to the bit line, source line, and control gate, or controls signals received through these lines. The peripheral transistor is a high-withstanding-voltage type transistor whose gate insulating film is much thicker than that of the memory cell. In the fifth embodiment, those parts that are common to the second embodiment will be denoted at common reference symbols.

Explained at first will be the structure of the memory cell array in the non-volatile semiconductor memory device according to the fifth embodiment.

Figure 12A:
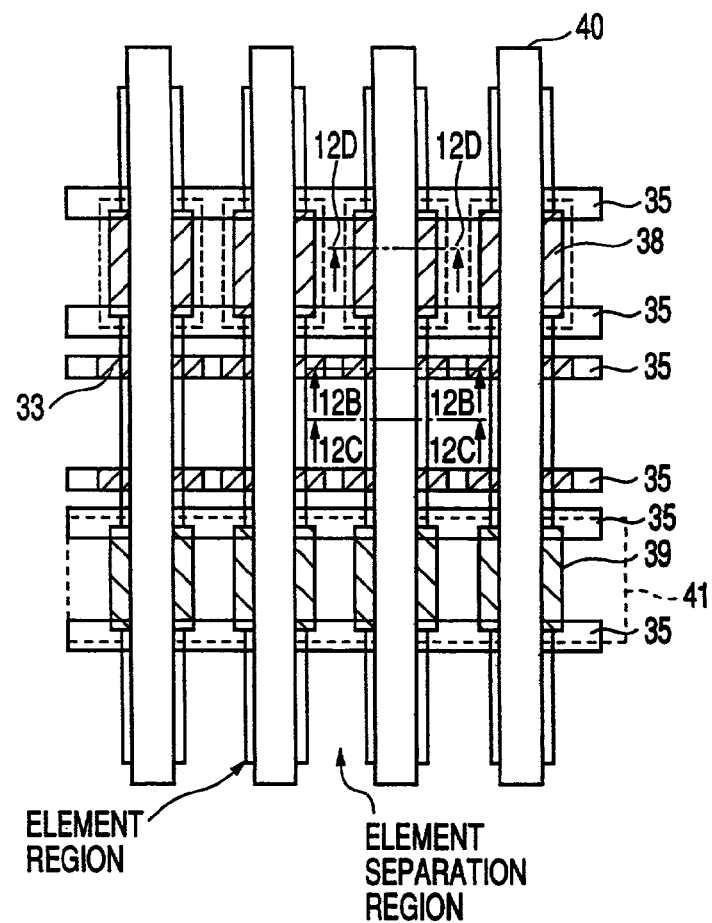
FIG. 12A is a plan view showing the structure of a memory cell array in the NAND-type non-volatile semiconductor memory device according to the fifth embodiment of the present invention.
Figure 12B:
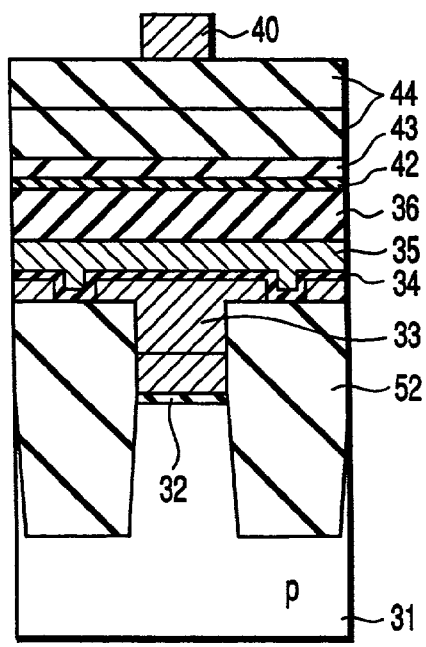
FIG. 12B is a cross-sectional view showing the memory cell array in the NAND-type non-volatile semiconductor memory device according to the fifth embodiment, cut along the line 12B-12B.
Figure 12C:
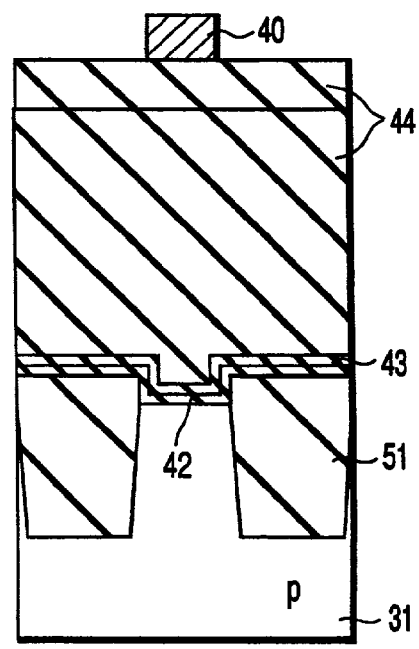
FIG. 12C is a cross-sectional view showing the memory cell array in the NAND-type non-volatile semiconductor memory device according to the fifth embodiment, cut along the line 12C-12C.
Figure 12D:
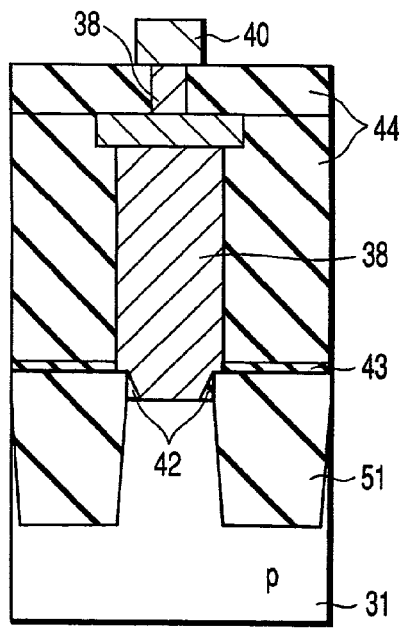
FIG. 12D is a cross-sectional view showing the memory cell array in the NAND-type non-volatile semiconductor memory device according to the fifth embodiment, cut along the line 12D-12D.

FIG. 12A is a plan view showing a memory cell array in the NAND-type non-volatile semiconductor memory device according to the fifth embodiment. FIG. 12B is a cross-sectional view of the memory cell array cut along the line 12B-12B. FIG. 12C is a cross-sectional view of the memory cell array cut along the line 12C-12C. FIG. 12D is a cross-sectional view of the memory cell array cut along the line 12D-12D.

FIG. 12B shows a cross-section along a word line of memory cells forming part of the memory cell array. As shown in FIG. 12B, a trench groove is formed in the p-type silicon semiconductor substrate (or p-type well). In the trench groove, an element separation insulating material such as silicon dioxide material is filled. In this manner, an element separation region 52 filled with the silicon dioxide material, and an element region separated by the element separation region 52 and not filled with the silicon dioxide material are formed. A thin tunnel insulating film 32 through which a tunnel current flows is formed in the entire surface of the channel region of the element region in the semiconductor substrate.

A charge storage layer 33 is formed on the tunnel insulating film 32. This charge storage layer 33 is formed such that a side end part thereof is aligned with the element separation region 52. The charge storage layer 33 partially extends over the element separation region 52 and is cut above the element separation region 52 to be separated for every memory cell. A control gate 35 is formed above the charge storage layer 33 with an inter-gate insulating film 34 inserted therebetween.

A gate cap film 36 is formed on the control gate 35. This gate insulating film 36 is made of, for example, a silicon nitride film. The gate cap film 36 and the control gate 35 are processed in a self-aligning manner to be vertical to the surface of the semiconductor substrate, such that the end parts of the film 36 and the gate 35 are aligned with the charge storage layer 33. A stacked gate is formed by the charge storage layer 33, the control gate 35, and the gate cap film 36.

A gate barrier film 42 made of a silicon dioxide film is formed on the gate cap film 36. A contact barrier film 43 made of a silicon nitride film is formed on the gate barrier film 42. An interlayer insulating film 44 is formed on the contact barrier film 43. Further, a bit line 40 is formed on the interlayer insulating film 44.

FIG. 12C shows a cross-section in the word line direction between word lines of the memory cell array. As shown in FIG. 12C, the element separation region 51 which is made of, for example, silicon dioxide material filled therein is formed in the trench groove. The element separation region 51 is formed to be thinner than the element separation region 52 exiting below the control gate 35. That is, the surface level of the element separation region 51 is lower than the surface level of the element separation region 52.

The gate barrier film 42 is formed on the semiconductor substrate 31 and the element separation region 51. The contact barrier film 43 is formed on the gate barrier film 42. The interlayer insulating film 44 is formed on the contact barrier film 43. Further, a bit line 40 is formed on the interlayer insulating film 44.

FIG. 12D shows a cross-section of the bit-line contact part of the memory cell array in the word line direction. As shown in FIG. 12D, for example, the element separation region 51 which is made of a silicon dioxide film filled therein is formed in the trench groove of the p-type silicon semiconductor substrate (or p-type well). The element separation region 51 is formed to be thinner than the element separation region 52 existing below the control gate 35. That is, the surface level of the element separation region 51 is lower than the surface level of the element separation region 52.

The contact barrier film 43 is formed on the semiconductor substrate 31 and the element separation region 51. The interlayer insulating film 44 is formed on the contact barrier film 43. Also, a bit-line contact material 38 is filled between the element separation regions 51 on the semiconductor substrate 31, such that the material 38 is in contact with the semiconductor substrate 31. Further, a bit line 40 is formed on the bit-line contact material 38. The contact barrier film 43 does not remain on the side surface in the side of the contact material 38 of the element separation region 51, but only the gate barrier film 42 remains thin. However, if the surface level of the element separation region 51 is much lower than the surface level of the element separation region 52, the gate barrier film 42 does not remain in some cases.

Next, explanation will be made of a peripheral transistor forming part of a peripheral circuit in the non-volatile semiconductor substrate according to the fifth embodiment.

Figure 13A:
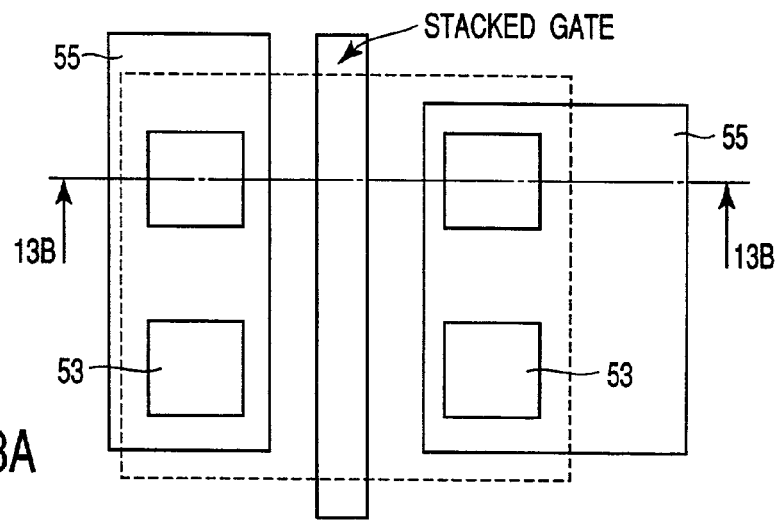
FIG. 13A is a plan view of a peripheral transistor forming part of a peripheral circuit in the NAND-type non-volatile semiconductor memory device according to the fifth embodiment of the present invention.
Figure 13B:
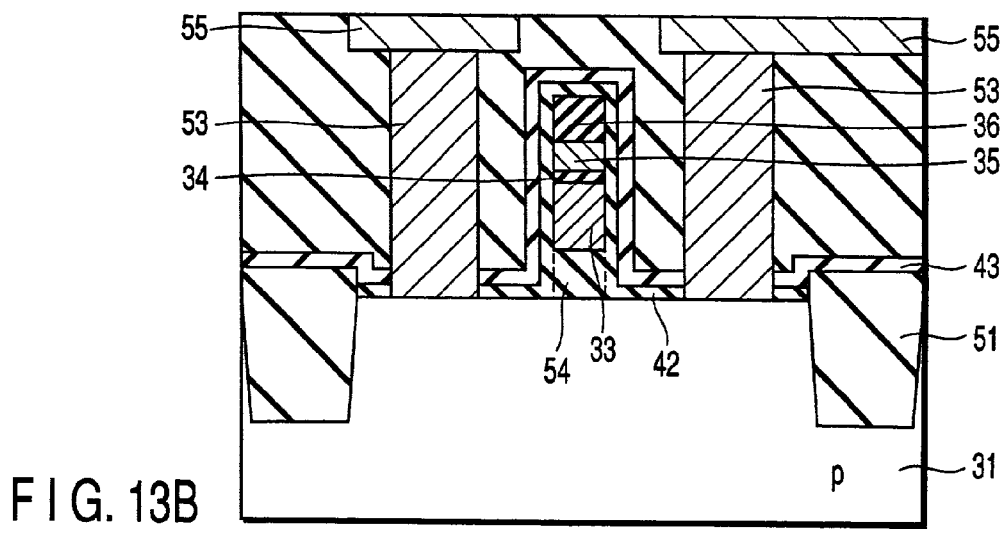
FIG. 13B is a cross-section of the peripheral transistor forming part of a peripheral circuit in the NAND-type non-volatile semiconductor memory device according to the fifth embodiment, cut along the line 13B-13B.

FIG. 13A is a plan view of a peripheral transistor forming part of a peripheral circuit in the NAND-type non-volatile semiconductor memory device according to the fifth embodiment. FIG. 13B is a cross-section of the peripheral transistor cut along the line 13B-13B.

As shown in FIG. 13B, the element separation region 51 which is made of, for example, silicon dioxide material filled in the trench groove, and an element region, which is separated by the element separation region 51 and is not filled with silicon dioxide material, are formed on the p-type silicon semiconductor substrate (or p-type well) 31. The element separation region 51 is formed to be thinner than the element separation region 52 existing below the control gate 35. That is, the surface level of the element separation region 51 is lower than the surface level of the element separation region 52.

A gate insulating film 54 which is much thicker than the gate insulating film 32 which the memory cells have is formed on the element region (channel region) in the semiconductor substrate 31. A charge storage layer 33 is formed on the gate insulating film 54. A control gate 35 is formed on the charge storage layer 33 with an inter-gate insulating film 34 inserted therebetween. A gate cap film 36 is formed on the control gate 35. This gate insulating film 36 is made of, for example, a silicon nitride film. The gate cap film 36 and the control gate 35 are processed in a self-aligning manner to be vertical to the surface of the semiconductor substrate such that side end parts of the film 36 and the gate 35 are aligned with the charge storage layer 33. A stacked gate is formed by the charge storage layer 33, the control gate 35, and the gate cap film 36.

Also, on the gate cap film 36, a gate barrier film 42 made of a silicon dioxide film is formed so as to cover the gate cap film 36. The gate barrier film 42 is also formed on the semiconductor substrate 31. A contact barrier film 43 made of a silicon nitride film is formed on the gate barrier film 42. The contact barrier film 43 is also formed on the element separation region 51. Further, an interlayer insulating film 44 is formed on the contact barrier film 43.

A contact material 53 is filled between the element separation region 51 and the stacked gate on the semiconductor substrate 31, such that the contact material 53 contacts the semiconductor substrate 31. A contact interconnection 55 is formed on the contact material 53. Between the element separation region 51 and the stacked gate, the gate insulating film 54 is removed (or thinned), on the semiconductor substrate 31. Therefore, only the gate barrier film 42 and the contact barrier film 43 are formed orderly on the semiconductor substrate 31. Therefore, in case of forming a contact hole in the semiconductor substrate 31 between the element separation region 51 and the stacked gate, the contact hole can be formed in the same step as that of forming a contact hole in the semiconductor substrate 31 between the element separation regions 51 as shown in FIG. 12D. As has been described above, the memory cell array according to the fifth embodiment and a peripheral transistor forming part of a peripheral circuit respectively have the structures described above.

Figure 5:
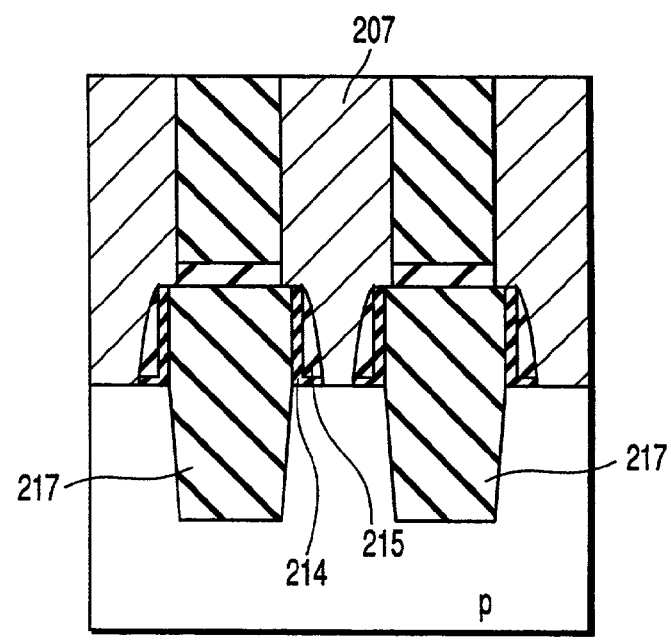
FIG. 5 is a cross-sectional view in case where the memory cell array shown in FIG. 4B is cut along the line 5-5 in FIG. 2A.

A self-aligned STI structure in which a side end part of the charge storage layer is aligned with a trench forming part of an element separation region is effective as an element separation structure in a flash memory. However, as shown in FIG. 5, the element separation region 217 is formed to be higher than the semiconductor substrate. Therefore, there is a problem that the gate barrier film 214 and the contact barrier film 215 remain, like spacers, on the side surface of the element separation region 217, in a region between adjacent control gates.

In this embodiment, the film thickness of the element separation region 51 between adjacent control gates (see FIG. 12D) is thinner than the film thickness of the element separation film 52 below the control gate 35 (see FIG. 12B). Thus, the element separation region 51 is thinned to reduce the gate barrier film 42 and the contact barrier film 43 on the side surface of the element separation region 51. In this manner, the exposed area of the semiconductor substrate 31 can be enlarged to lower the contact resistance, at the part where the bit line contact material 38 is formed.

In a non-volatile semiconductor memory device, particularly, the film thickness of the gate insulating film of the high-withstanding-voltage-based transistor of the peripheral transistor forming part of the peripheral circuit is generally much thicker than that of the gate insulating film of the memory cell. Therefore, in a step of forming a contact hole in the peripheral transistor, the contact barrier film and the gate barrier film are etched, and thereafter, the thick gate insulating film of the peripheral transistor needs to be removed. If a contact hole in the high-withstanding-voltage-based peripheral transistor and a bit-line contact hole having a self-aligned contact structure are formed simultaneously in one same step, drawbacks occur in that the gate cap film 36 is reduced and the element separation region 51 partially extending over the contact hole shifts back. It is therefore difficult to form a contact hole in the peripheral transistor at the same time when a bit-line contact hole is formed.

In contrast, in the present embodiment, as shown in FIGS. 13A and 13B, a gate insulating film 54 on the diffusion layer (the semiconductor substrate 31) where a contact hole (contact material 53) of a high-withstanding-voltage-based transistor is previously formed is thinned or removed. In this manner, it is possible to form a contact hole of the high-withstanding-voltage-based transistor, at the same time when a contact hole of the bit-line contact part is formed.

Explanation will now be made of a method of forming the non-volatile semiconductor memory device according to the fifth embodiment.

At first, a stacked gate including a gate cap film 36 is formed by vertical process. Thereafter, the element separation region 51 between stacked gates and the gate insulating film 54 between stacked gates are etched, with the gate cap mask 36 used as a mask. At this time, it is important to subject the silicon nitride film as the gate cap film 36 and the silicon substrate 31 to etching which attains a high selection ratio. In addition, the etching amount must be set to such an amount that can remove the gate insulating film 54 of the high-withstanding-voltage-based transistor.

Further, the surface level of the element separation region 51 must be higher than the surface of the semiconductor substrate 31 where the trench is formed and must be lower than the upper surface of the charge storage layer 33. By this etching, the thickness of the element separation region 51 between the stacked gates becomes smaller than the film thickness of the element separation region 52 below the stacked gates. Thereafter, surface processing is performed on the side surface of the stacked gates by thermal oxidation or the like, and the gate barrier film 42 and the contact barrier film 43 are formed thereafter.

According to the manufacturing method as described above, the element separation region 51 is thinned previously, so that the height of the exposed side surface of the element separation region 51 is lowered. Therefore, residues like spacers (the gate barrier film 42 and the contact barrier film 43) can be prevented from remaining when a contact hole is opened.

The present invention is not limited to the embodiments described above. The thickness of the gate insulating film and the materials of the electrodes can be selected arbitrarily.

Preferred embodiments of the present invention will now be described below.

1. The conductive material forming the charge storage layer is, for example, a polycrystalline or non-crystalline silicon material having a high electric conductance by doping impurities.

2. The charge storage layer is formed on, for example, a thermal oxide film having a film thickness of about 100 Å.

3. The control gate is a single layer made of a silicon material such as a polycrystalline or non-crystalline silicon material having a high electric conductance by doping impurities, a high-melting-point metal material such as tungsten (W) or the like, a layered structure of silicide such as tungsten silicide (WSi) or the like and silicon, silicide formed by depositing metal such as titanium (Ti) or the like on the above-described silicon material and by letting the resultant chemically reacting silicon by thermal annealing, or a low-resistance metal material such as aluminum (Al) or the like.

4. The control gate is formed on, for example, a silicon dioxide film having a thickness of about 100 Å to 200 Å, or a layered film comprised of a silicon dioxide film and a silicon nitride film, which is formed on the charge storage layer.

5. The element separation insulating film is a silicon dioxide material having an excellent burring characteristic with a high aspect ratio, PSG or BPSG containing impurities such as phosphorus (P) or boron (B), or a layered structure of the materials described above.

In the embodiments of the present invention, of a memory cell and a selection transistor which are covered with a first insulating film (e.g., silicon dioxide film) and a second insulating film (e.g., a silicon nitride film), the first insulating film is removed from the side surfaced of the stacked gate which is adjacent to the bit-line contact. Further, the element separation insulating film between control gates is arranged to be thinner than the element separation insulating film below the control gate, to lower the height of the side wall of the element separation insulating film at the bit-line contact part. Further, the film thickness of the gate insulating film at the contact part connected to the source diffusion layer or drain diffusion layer of the high-withstanding-voltage-based transistor is arranged to be smaller than the film thickness of the gate insulating film below the gate electrode of the transistor. In this manner, the processing margin which is taken to construct the bit-line contact into a self-aligned contact structure can be set to be high. Accordingly, it is possible to realize a non-volatile semiconductor memory device capable of achieving high density and high reliability.

Although a silicon dioxide film is used as a first insulating film, another oxide-based insulating film may be used. The another oxide-based insulating film may be, for example, a metal oxide film such as an aluminum oxide film ($Al_2O_3$ or the like), a tantalum oxide film ($Ta_3O_5$ or the like), or the like. Although a silicon nitride film is used as a second insulating film, another nitride-based insulating film may be used.

As has been described above, according to an embodiment of the present invention, it is possible to provide a non-volatile semiconductor memory device which is capable of attaining a high processing margin when the bit-line contact is constructed into a self-aligned contact structure and is also capable of achieving high density and high reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
   a semiconductor substrate including a memory cell region and a peripheral transistor region, the memory cell region including a plurality of first element regions and a plurality of first separation regions which insulate between the first element regions, the peripheral transistor region including a plurality of second element regions and a plurality of second separation regions which insulate between the second element regions;
   a memory cell array formed on the memory cell region and including a memory cell having a first source region, a first drain region, a first gate insulating film having a first film thickness, a first stacked gate formed on the first gate insulating film, and a first contact member;
   a peripheral transistor formed on the second element region and including a second source region, a second drain region, a second gate insulating film having a second film thickness thicker than the first film thickness, and a second stacked gate;
   a gate barrier film covering a whole of the second stacked gate and formed integrally on the second source region and the second drain region, the gate barrier film having a third film thickness;
   a contact barrier film covering the gate barrier film and the second separation regions, and having a fourth film thickness, thinner than the second film thickness; and
   a second contact member connected to at least one of the second source and drain regions of the peripheral transistor, the second contact member contacting the gate barrier film and the contact barrier film,
   wherein a first upper end portion of the first separation regions protrudes from an upper surface of the semiconductor substrate and is higher than a second upper end portion of the second separation regions.

2. The device according to claim 1, wherein the first stacked gate of the memory cell includes a charge-storage layer on the first gate insulating film and a control gate on the charge-storage layer, and the second stacked gate of the peripheral transistor includes a first gate on the second gate insulating film and a second gate on the first gate.

3. The device according to claim 2, wherein the peripheral transistor is a high-withstanding-voltage transistor for driving high voltages for writing and erasure applied to the memory cell during the operation of supplying/receiving charges to/from the memory cell.

4. The device according to claim 2, further comprising:
   a first inter-gate insulating film formed between the charge-storage layer and the control gate;
   a second inter-gate insulating film formed between the first gate and the second gate;
   wherein the first gate is formed of the same material as the charge-storage layer, and the second gate is formed of the same material as the control gate.

5. The device according to claim 2, wherein the first gate has a film thickness equal to that of the charge-storage layer, and the second gate has a film thickness equal to that of the control gate.

6. The device according to claim 1, wherein the contact barrier film is made of a silicon nitride film.

7. The device according to claim 1, wherein the gate barrier film is made of a silicon dioxide film.

* * * * *